(12) United States Patent
Chen et al.

(10) Patent No.: US 9,536,772 B2
(45) Date of Patent: Jan. 3, 2017

(54) FIN STRUCTURE OF SEMICONDUCTOR DEVICE

(71) Applicant: Taiwan Semiconductor Manufacturing Company, Ltd., Hsin-Chu (TW)

(72) Inventors: Chung-Hsien Chen, Taipei (TW); Tung Ying Lee, Hsin-Chu (TW); Yu-Lien Huang, Jhubei (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/793,567

(22) Filed: Jul. 7, 2015

(65) Prior Publication Data

US 2015/0311111 A1 Oct. 29, 2015

Related U.S. Application Data

(62) Division of application No. 13/915,441, filed on Jun. 11, 2013, now Pat. No. 9,093,531.

(51) Int. Cl.
*H01L 29/04* (2006.01)
*H01L 21/324* (2006.01)
(Continued)

(52) U.S. Cl.
CPC ... *H01L 21/76221* (2013.01); *H01L 21/02233* (2013.01); *H01L 21/30604* (2013.01);
(Continued)

(58) Field of Classification Search
CPC .... H01L 21/306; H01L 21/324; H01L 21/762; H01L 29/66; H01L 29/04; H01L 29/7842; H01L 29/0649; H01L 29/66818; H01L 29/66795; H01L 21/30604; H01L 21/30625; H01L 21/76221
See application file for complete search history.

(56) References Cited

U.S. PATENT DOCUMENTS 7,154,118 B2 12/2006 Lindert et al.
7,799,592 B2 9/2010 Lochtefeld
(Continued)

FOREIGN PATENT DOCUMENTS

EP 2299475 3/2011
KR 20130023135 3/2013
(Continued)

*Primary Examiner* — Fazli Erdem
(74) *Attorney, Agent, or Firm* — Slater Matsil, LLP (57) ABSTRACT

The disclosure relates to a fin structure of a semiconductor device. An exemplary fin structure for a semiconductor device comprises a lower portion protruding from a major surface of a substrate, wherein the lower portion comprises a first semiconductor material having a first lattice constant; an upper portion having an interface with the lower portion, wherein the upper portion comprises a second semiconductor material having a second lattice constant different from the first lattice constant; a first pair of notches lower than the interface and extending into opposite sides of the lower portion, wherein each first notch have a first width; and a second pair of notches extending into opposite sides of the interface, wherein each second notch have a second width greater than the first width.

20 Claims, 13 Drawing Sheets

(51) Int. Cl.
*H01L 21/762* (2006.01)
*H01L 29/78* (2006.01)
*H01L 21/02* (2006.01)
*H01L 29/06* (2006.01)
*H01L 29/66* (2006.01)
*H01L 21/306* (2006.01)

(52) U.S. Cl.
CPC ...... *H01L 21/30625* (2013.01); *H01L 21/324* (2013.01); *H01L 29/04* (2013.01); *H01L 29/0649* (2013.01); *H01L 29/66795* (2013.01); *H01L 29/66818* (2013.01); *H01L 29/785* (2013.01)

(56) References Cited

U.S. PATENT DOCUMENTS

| | | | |
|---|---|---|---|
| 8,049,286 B2 | 11/2011 | Tateshita | |
| 8,440,517 B2 | 5/2013 | Lin et al. | |
| 8,796,666 B1* | 8/2014 | Huang | H01L 29/66795 257/18 |
| 2007/0231997 A1* | 10/2007 | Doyle | H01L 29/66818 438/253 |
| 2010/0248454 A1* | 9/2010 | Maszara | H01L 29/66795 438/478 |
| 2011/0081764 A1* | 4/2011 | Maszara | H01L 29/785 438/413 |
| 2012/0001239 A1 | 1/2012 | Ko et al. | |
| 2012/0086053 A1* | 4/2012 | Tseng | H01L 29/66795 257/288 |
| 2012/0299099 A1* | 11/2012 | Huang | H01L 29/66795 257/347 |
| 2013/0049121 A1 | 2/2013 | Baldauf et al. | |
| 2014/0239354 A1 | 8/2014 | Huang et al. | |
| 2014/0319462 A1 | 10/2014 | Huang et al. | |
| 2015/0008483 A1* | 1/2015 | Ching | H01L 29/7856 257/190 |
| 2015/0187944 A1* | 7/2015 | Ching | H01L 29/7851 257/190 |

FOREIGN PATENT DOCUMENTS

| | | |
|---|---|---|
| TW | I269358 | 12/2006 |
| TW | 200849595 | 12/2008 |
| TW | 201112415 | 4/2011 |

* cited by examiner

FIN STRUCTURE OF SEMICONDUCTOR DEVICE

PRIORITY CLAIM

This application claims the benefit to and is a division of U.S. patent application Ser. No. 13/915,441, filed on Jun. 11, 2013, entitled "Fin Structure of Semiconductor Device" which application is incorporated herein by reference.

TECHNICAL FIELD

The disclosure relates to integrated circuit fabrication, and more particularly to a semiconductor device with a fin structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, poor isolation between adjacent fins causes high leakage current of the FinFET, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
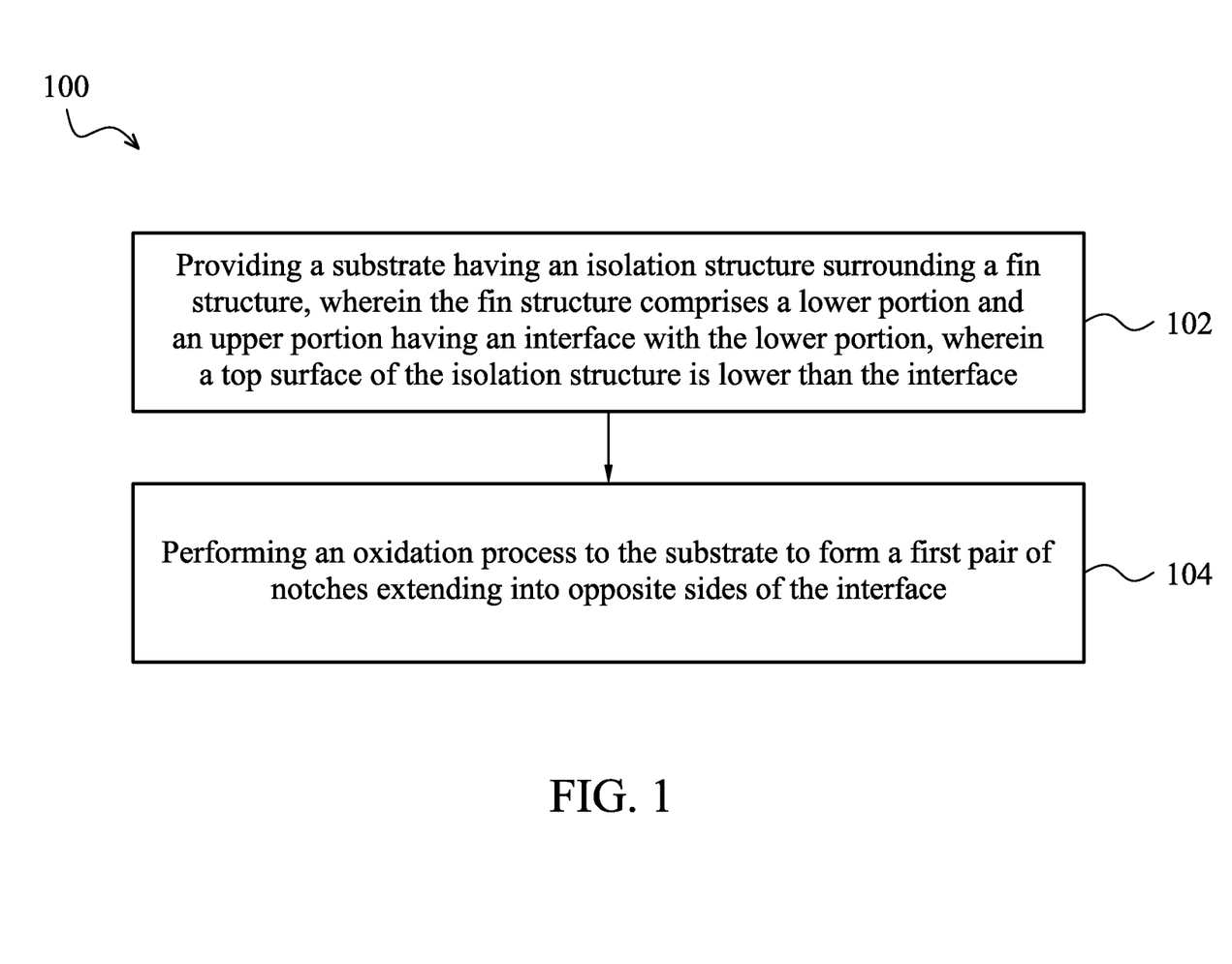
FIG. 1 is a flowchart illustrating a method of fabricating a semiconductor device according to various aspects of the present disclosure.

Referring to FIG. 1, illustrated is a flowchart of a method 100 of fabricating a semiconductor device according to various aspects of the present disclosure. The method 100 begins with step 102 in which a substrate having an isolation structure surrounding a fin structure is provided, wherein the fin structure comprises a lower portion and an upper portion having an interface with the lower portion, wherein a top surface of the isolation structure is lower than the interface. The method 100 continues with step 104 in which an oxidation process is performed to the substrate to form a first pair of notches extending into opposite sides of the lower portion and a second pair of notches extending into opposite sides of the interface. The discussion that follows illustrates embodiments of semiconductor devices that can be fabricated according to the method 100 of FIG. 1.

FIGS. 2-9 are cross-sectional views of a semiconductor device 200 at various stages of fabrication according to various embodiment of the present disclosure. As employed in the present disclosure, the term semiconductor device 200 refers to a fin field effect transistor (FinFET) and is hereinafter referred to as FinFET 200. The FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 9 are simplified for a better understanding of the concepts of the present disclosure. For example, although the figures illustrate the FinFET 200, it is understood the IC may comprise a number of other devices comprising resistors, capacitors, inductors, fuses, etc.

Figure 5:
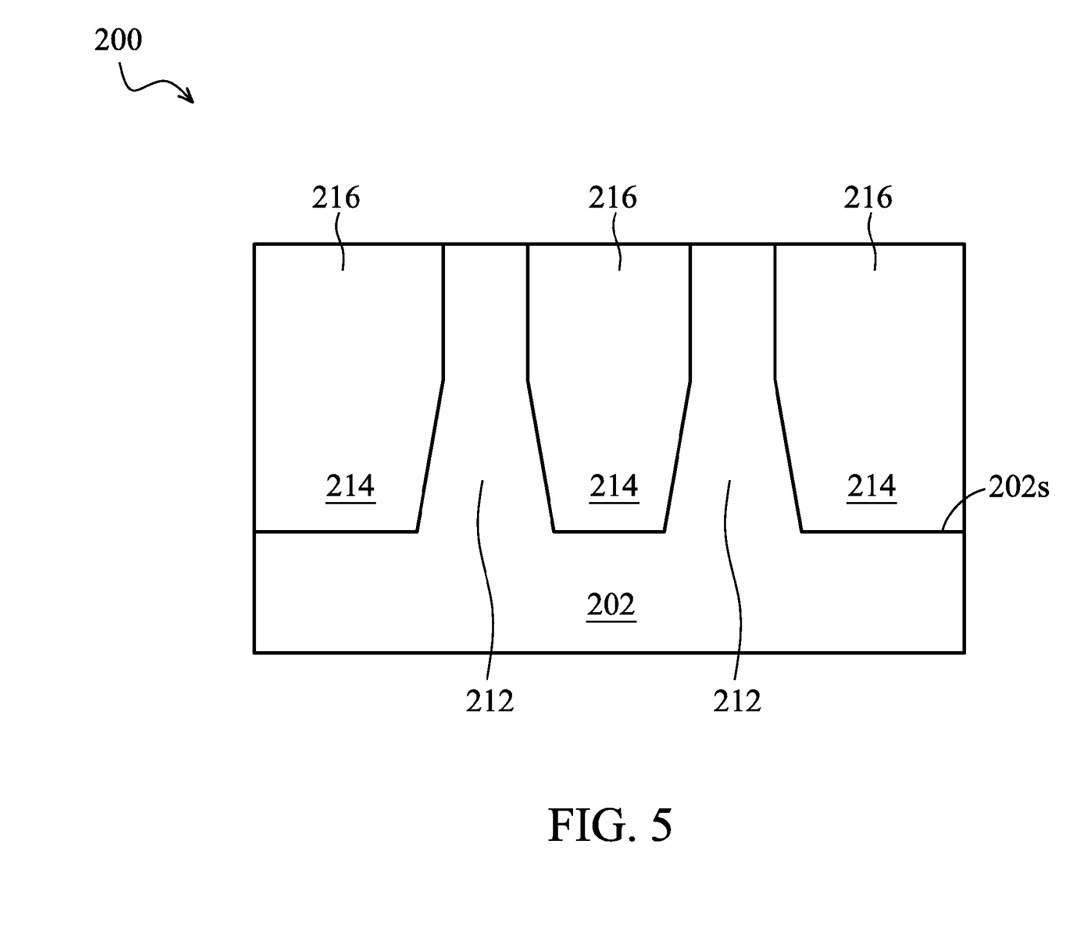
Figure 6:
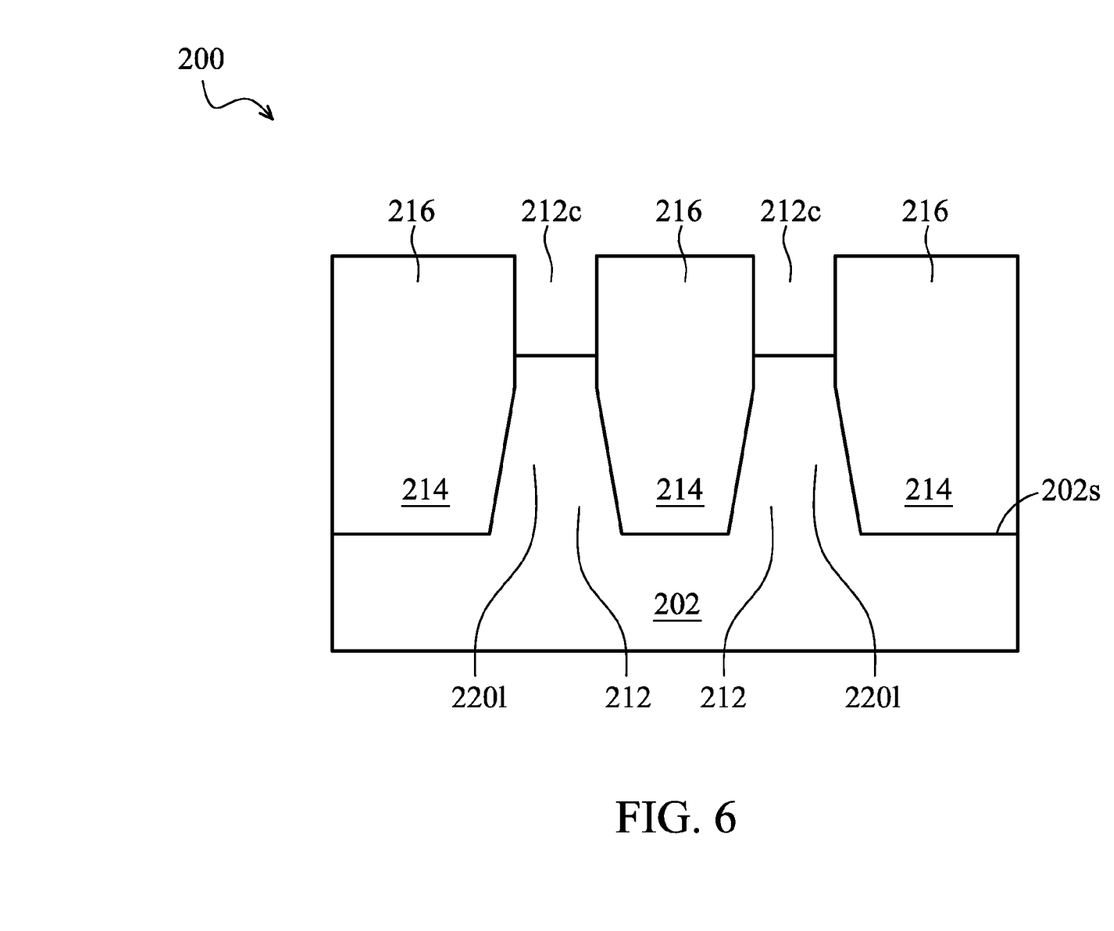
Figure 7:
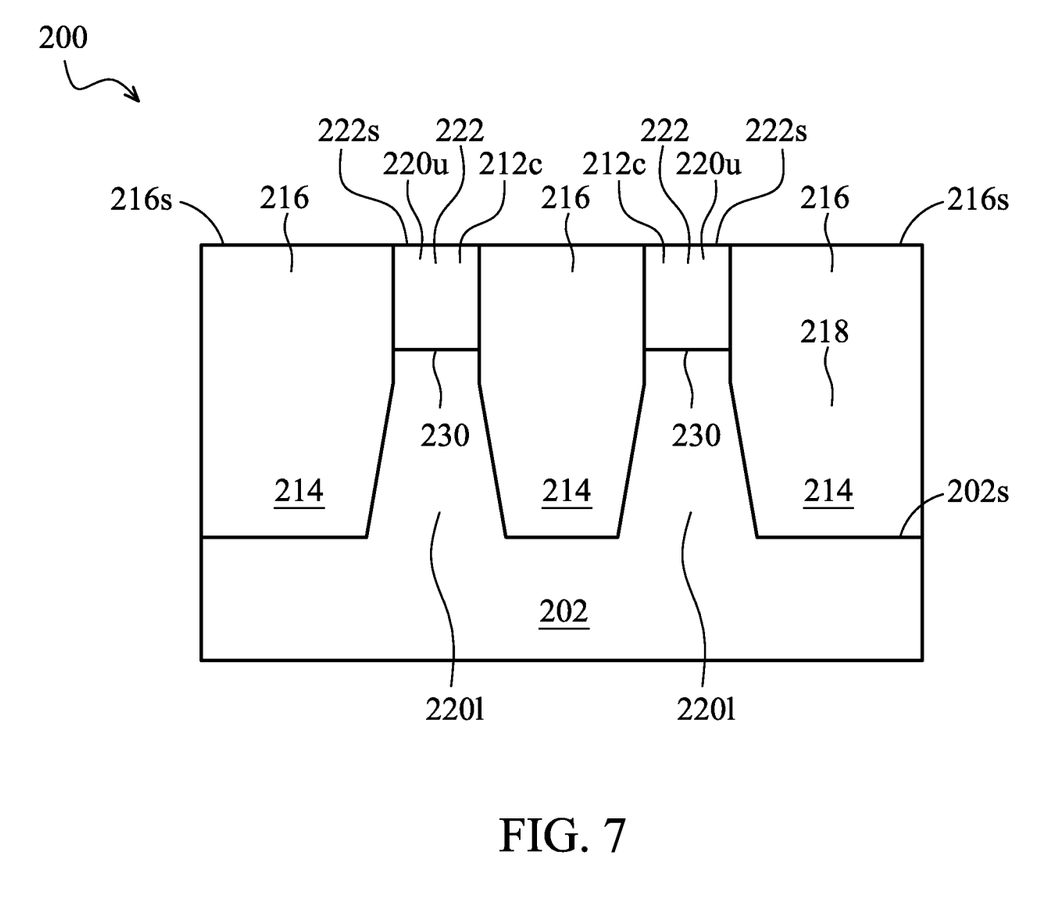

As depicted in FIGS. 2-9, and step 102 in FIG. 1, a substrate 202 having an isolation structure 218 surrounding a fin structure 220 is provided, wherein the fin structure 220 comprises a lower portion 220l and an upper portion 220u having an interface 230 with the lower portion 220l, wherein a top surface 218s of the isolation structure 218 is lower than the interface 230 (shown in FIG. 7).

Figure 2:
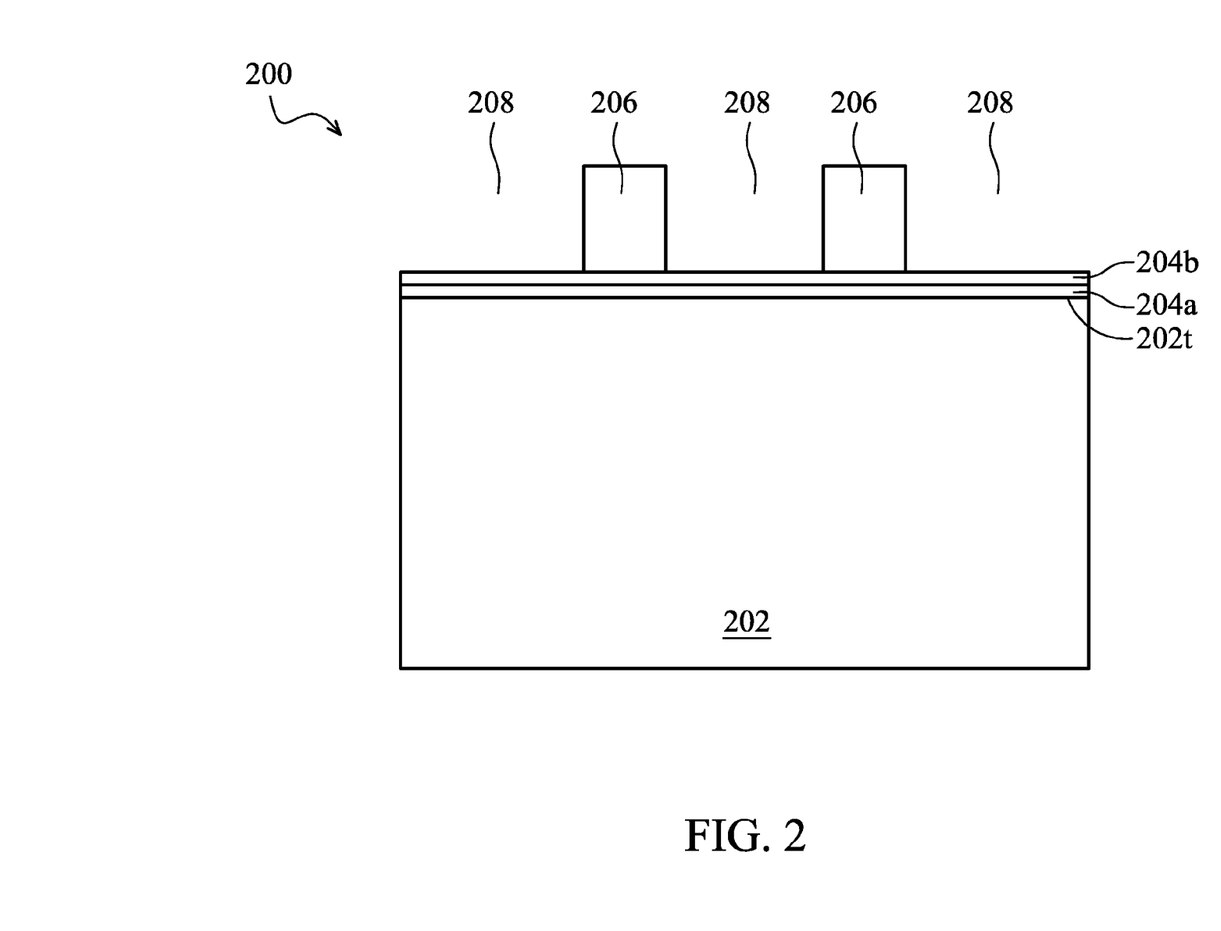
FIGS. 2-9 are cross-sectional views of a semiconductor device at various stages of fabrication according to various embodiment of the present disclosure.

Referring to FIG. 2, the substrate 202 comprises a first semiconductor material having a first lattice constant and hence is also referred to as first semiconductor material 202 in the present disclosure. In some embodiments, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 202 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 202 may include an epitaxial layer (epi-layer), may be strained for performance enhancement, and/or may include a silicon-on-insulator (SOI) structure.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 3:
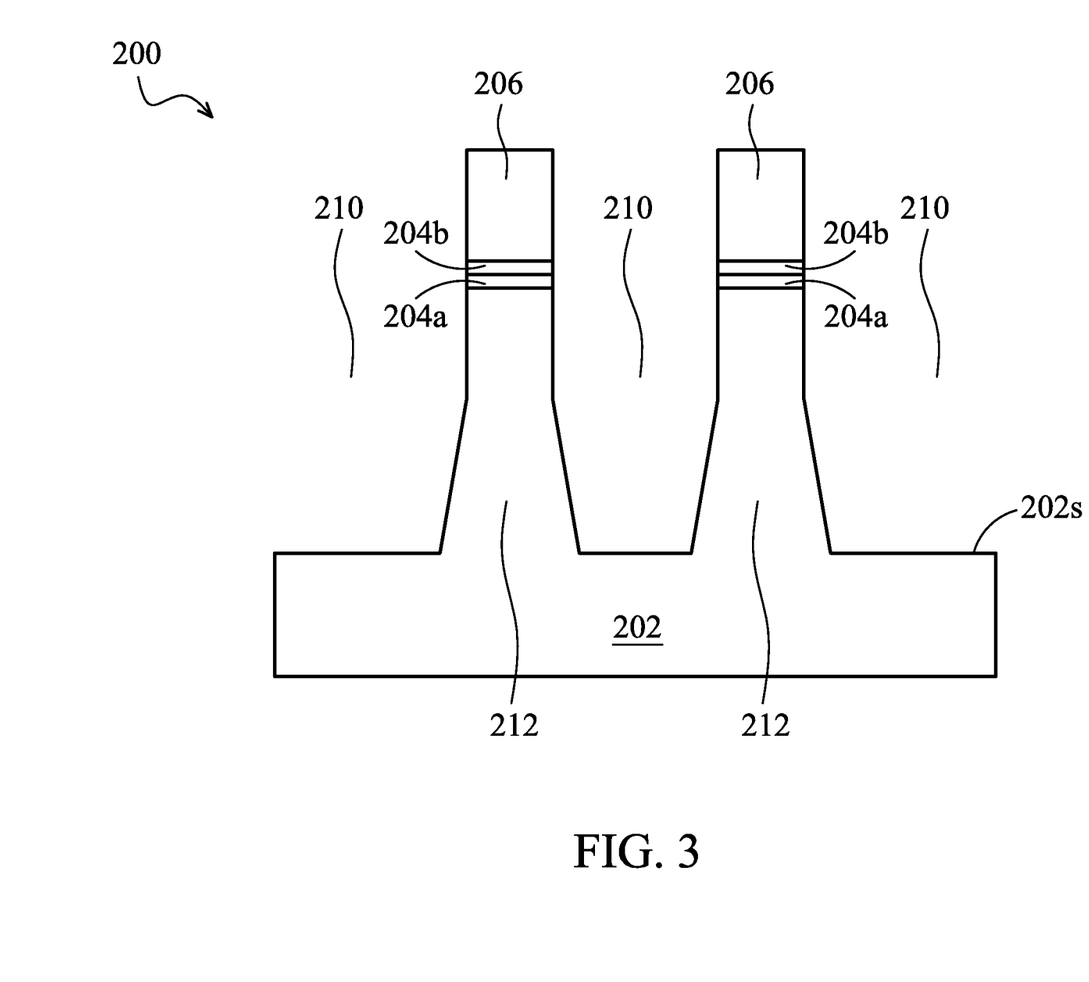
Figure 4:
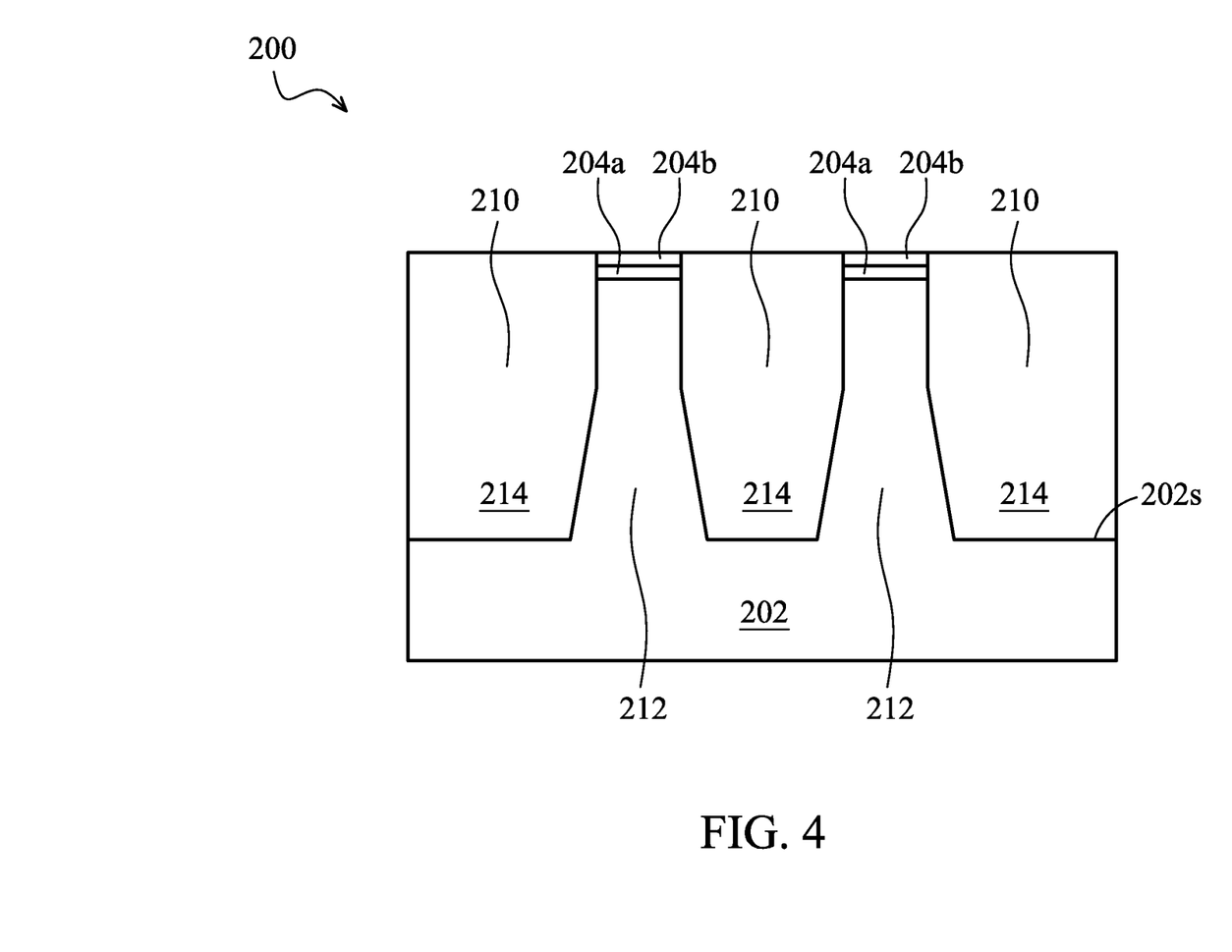

As depicted in FIGS. 3-5, for forming shallow trench isolation (STI) regions (such as STI regions 216 shown in FIG. 5) within the substrate 202, the structure in FIG. 3 is produced by forming semiconductor fins 212 in the substrate 202. In some embodiments, the mask layer 204b and pad layer 204a are etched through openings 208 to expose underlying semiconductor substrate 202. The exposed semiconductor substrate 202 is then etched to form trenches 210 with major surfaces 202s of the semiconductor substrate 202. Portions of the semiconductor substrate 202 between trenches 210 form the semiconductor fins 212. In some embodiments, the trenches 210 may be strips (viewed from in the top of the FinFET 200) parallel to each other, and closely spaced with respect to each other. In some embodiments, the trenches 210 may be continuous and surrounding the semiconductor fins 212.

In the depicted embodiment, the semiconductor fins 212 protruding from the substrate major surface 202s comprises two fins. In some embodiments, the FinFET 200 may comprise less than or more than two fins, for example, one fin or three fins. The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

FIG. 4 depicts the resulting structure after the deposition of a dielectric material 214. In some embodiments, the trenches 210 are filled with the dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In some embodiments, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

A chemical mechanical polish is then performed to form the STI regions 216, followed by the removal of the mask layer 204b and pad layer 204a (shown in FIG. 5). In one embodiment, the mask layer 204b is formed of silicon nitride, the mask layer 204b may be removed using a wet process using hot $H_3PO_4$, while pad layer 204a may be removed using diluted HF acid, if formed of silicon oxide.

As depicted in FIGS. 6 and 7, upper portions of the semiconductor fins 212 are replaced by other semiconductor material to enhance device performance. Using the STI regions 216 as a hard mask, an anisotropic plasma etching process is performed to recess semiconductor fins 212 that are unprotected or exposed to form the channel cavities 212c between the neighboring STI regions 216 (shown in FIG. 6). The remaining portions of the semiconductor fins 212 between the neighboring STI regions 216 are hereinafter referred to as lower portion 220l of the fin structure 220, protruding from the major surface 202s of the substrate 202. In some embodiments, the lower portion 220l may include the first semiconductor material 202 having the first lattice constant. In some embodiments, the first semiconductor material 202 comprises Si, Ge, SiGe, or III-V semiconductor material. In some embodiments, the etching process may be performed using a chemical selected from $Cl_2$, HBr, $NF_3$, $CF_4$, and $SF_6$ as an etching gas.

Next, the structure of FIG. 7 is produced by selectively growing a second semiconductor material 222 filling in the channel cavities 212c, wherein the second semiconductor material 222 has a second lattice constant different from the first lattice constant. In some embodiments, the first lattice constant is greater than second lattice constant. In some embodiments, the first lattice constant is less than second lattice constant. In some embodiments, the second semiconductor material 222 comprises Si, Ge, SiP, SiCP, SiGe, or III-V semiconductor material. After the growing, a planarization such as a CMP is performed, so that a top surface 222s of the second semiconductor material 222 is substantially level with a top surface 216s of the STI regions 216. In some embodiments, the second semiconductor material 222 forms upper portions 220u of the fin structure 220. Further, the upper portion 220u has an interface 230 with the lower portion 220l.

In some embodiments for an n-type FinFET, the second semiconductor material 222 comprises SiP or SiCP. In the depicted embodiment, the second semiconductor material 222 such as SiCP is selectively grown by an LPCVD process to fill the channel cavities 212c. In the depicted embodiment, the LPCVD process is performed at a temperature of about 400 to 800° C. and under a pressure of about 1 to 100 Torr, using $SiH_4$, $CH_4$, $PH_3$, and $H_2$ as reaction gases.

In some embodiments for a p-type FinFET, the second semiconductor material 222 comprises SiGe. In the depicted embodiment, the second semiconductor material 222 such as SiGe is selectively grown by an LPCVD process to fill the channel cavities 212c. In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

Figure 8:
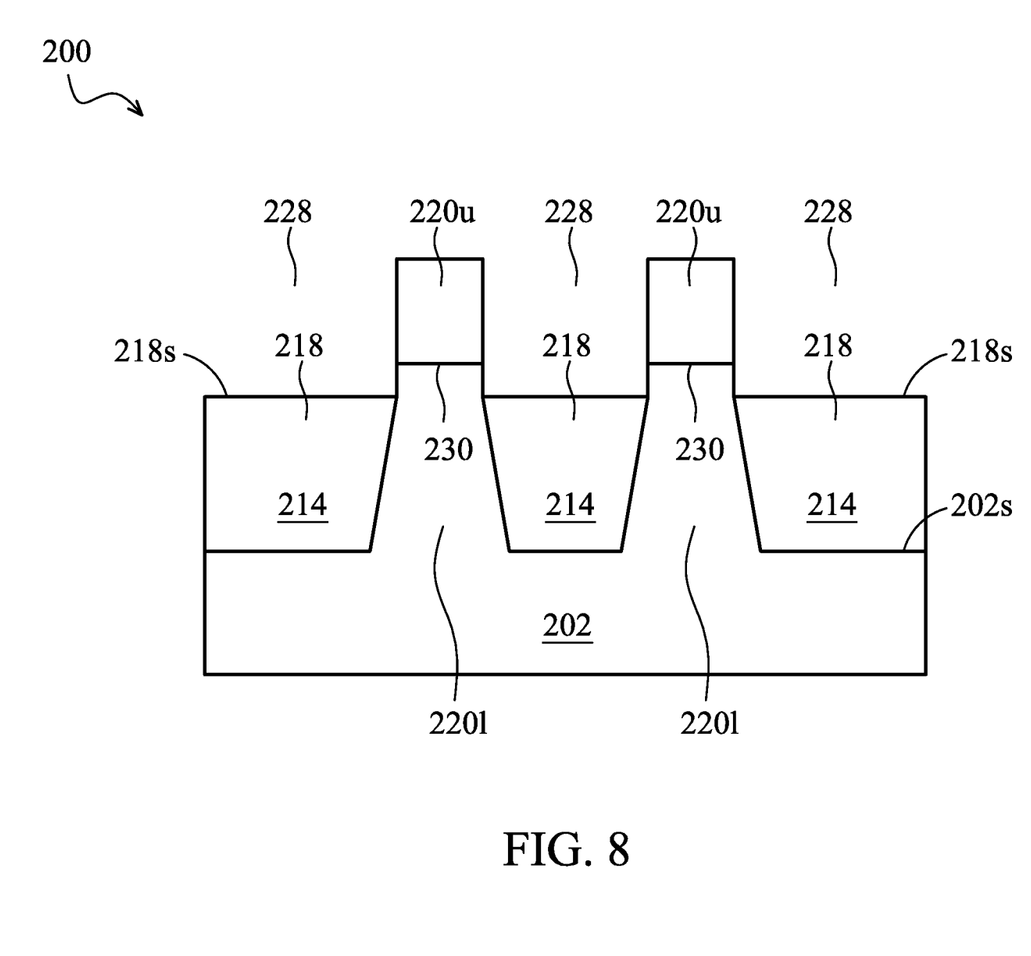

After selectively growing the second semiconductor material 222 filling in the channel cavities 212c, the STI regions 216 are recessed by an etching step to expose the upper portion 220u and a portion of the lower portion 2201, resulting in recesses 228 and a remaining oxide 214 (shown in FIG. 8). The remaining oxide 214 surrounding the fin structure 220 is hereinafter referred to as the isolation structure 218, wherein a top surface 218s of the isolation structure 218 is lower than the interface 230. In some embodiments, the etching step may be performed using a wet etching process, for example, by dipping the substrate 202 in hydrofluoric acid (HF). In some embodiments, the etching step may be performed using a dry etching process, for example, the dry etching process may be performed using $CHF_3$ or $BF_3$ as etching gases. In the depicted embodiment, the exposed portion (i.e., the upper portion 220u and a portion of the lower portion 2201) comprises source/drain (S/D) portions and a channel portion between the S/D portions. The channel portion is used to form channel region of the FinFET 200.

The process steps up to this point have provided the substrate 202 having the fin structure 220 protruding from the major surface 202s. Conventionally, fins of the fin structure 220 are closely spaced with respect to each other. By introducing the isolation structure 218 surrounding the fin structure 220, each fin of the fin structure 220 is isolated from neighboring fins. However, the substrate 202 may provide a carrier transportation path between adjacent fins. Poor isolation between adjacent fins causes high leakage current of the FinFET, thereby degrading the device performance.

Accordingly, the processing discussed below with reference to FIG. 9 may form a plurality of pairs of notches in the fin structure 220 to narrower carrier transportation path between adjacent fins. Problems associated with high leakage current due to poor isolation may be reduced and/or avoided. Thus, Applicant's method may achieve the desired device performance characteristics, such as breakdown effect and leakage.

Figure 9:
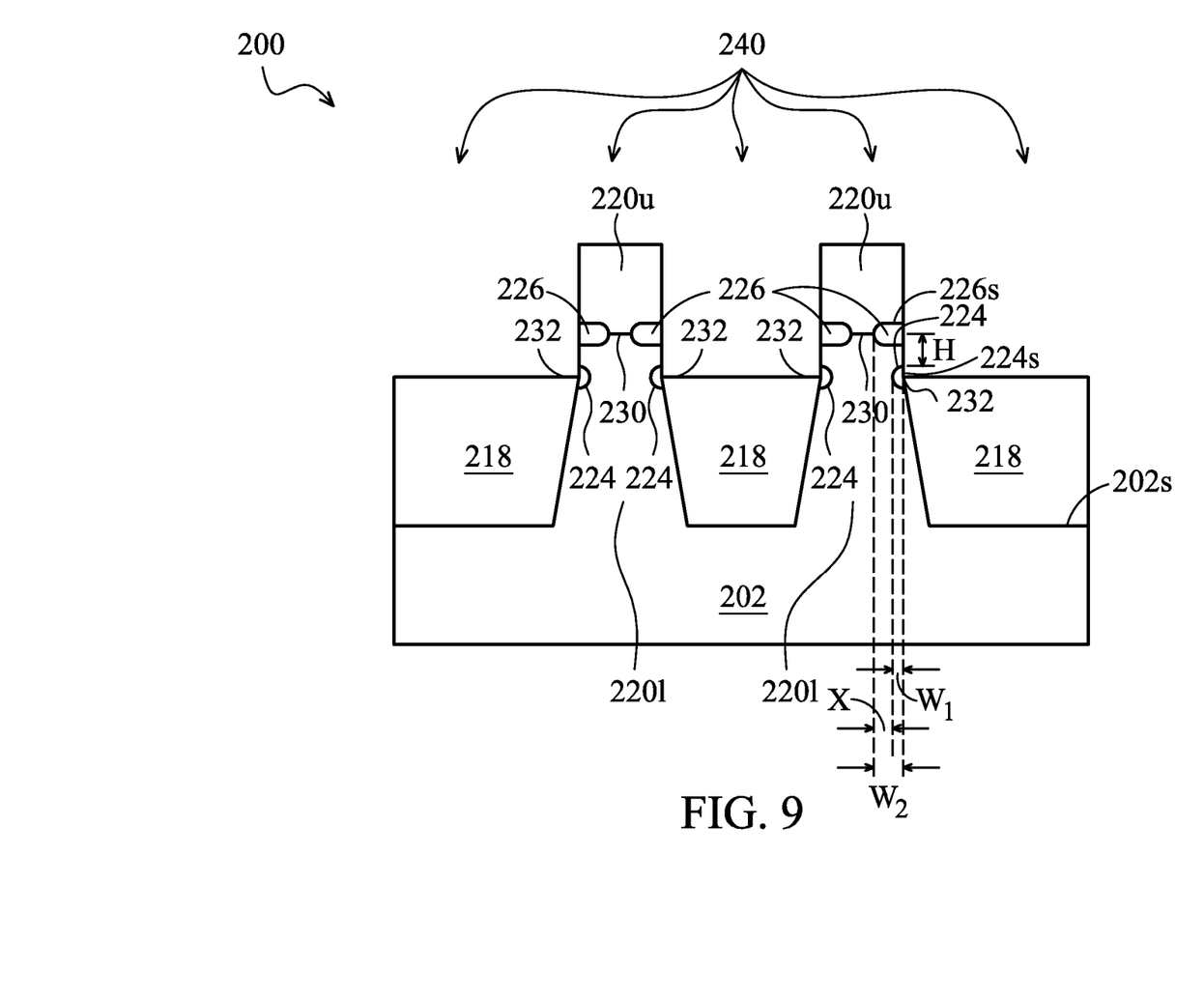
Figure 10:
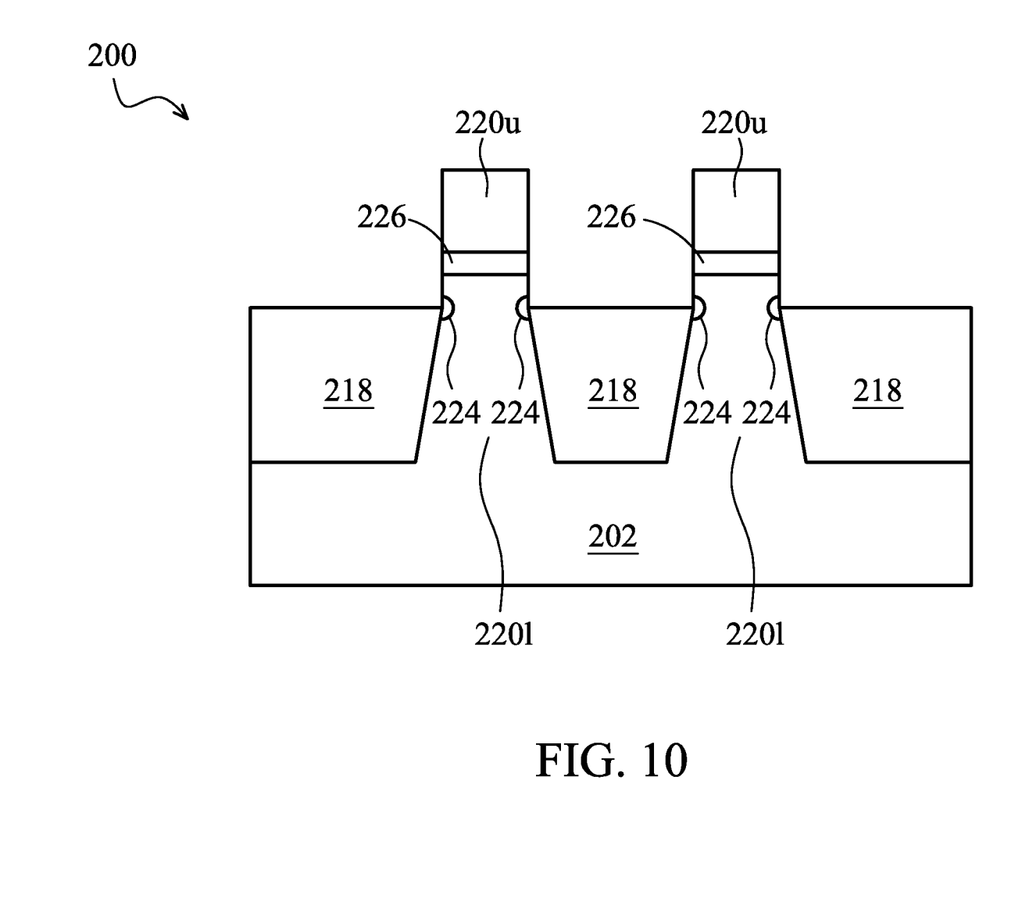
FIGS. 10-13 are cross-sectional views of a semiconductor device according to various embodiment of the present disclosure.
Figure 11:
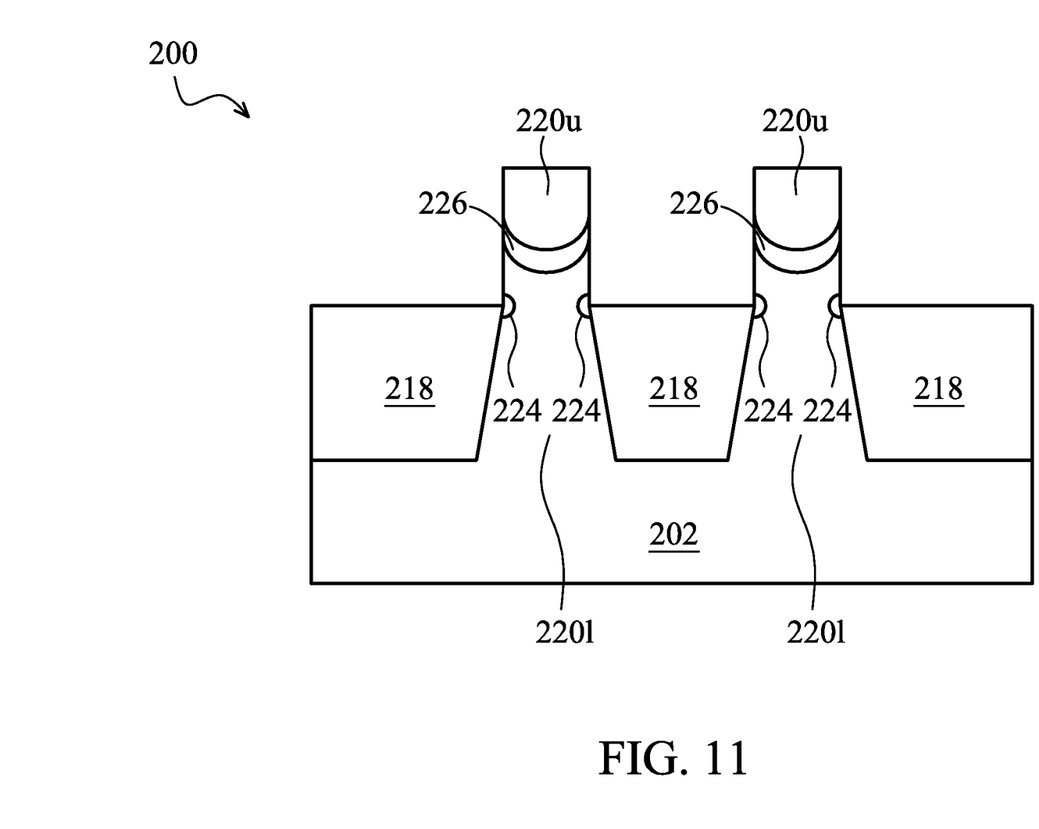
Figure 12:
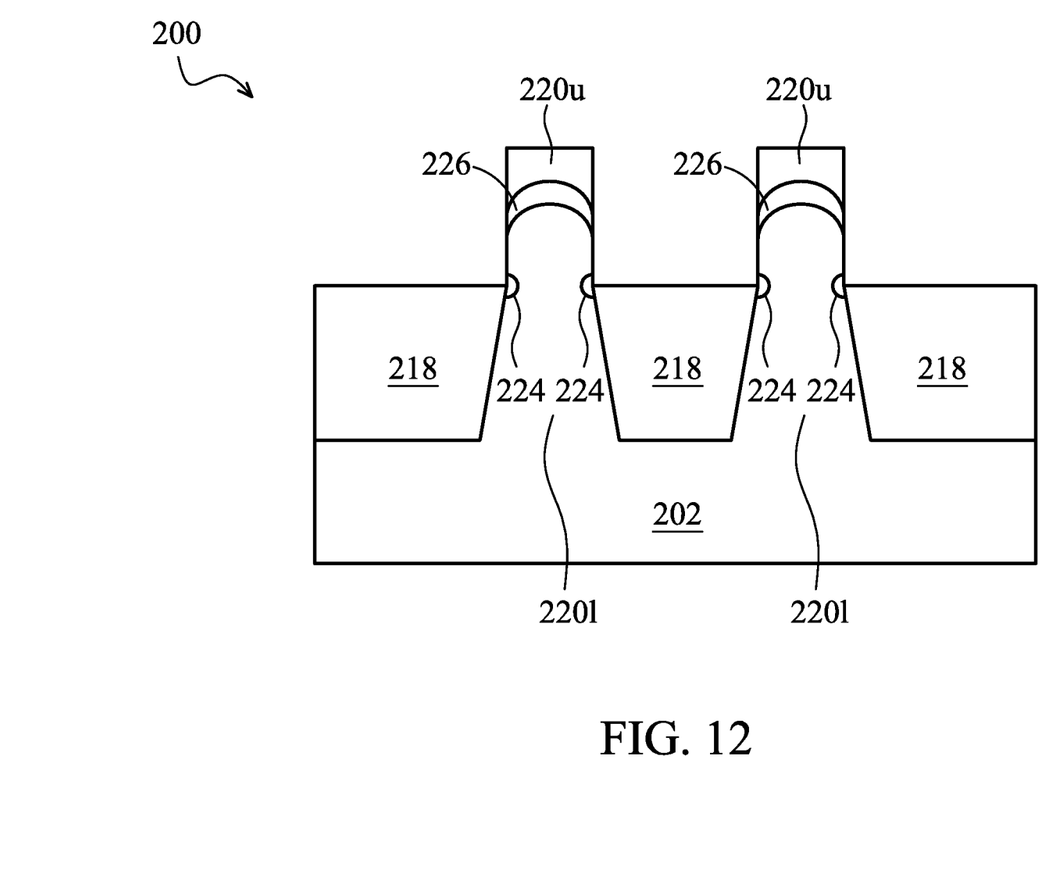
Figure 13:
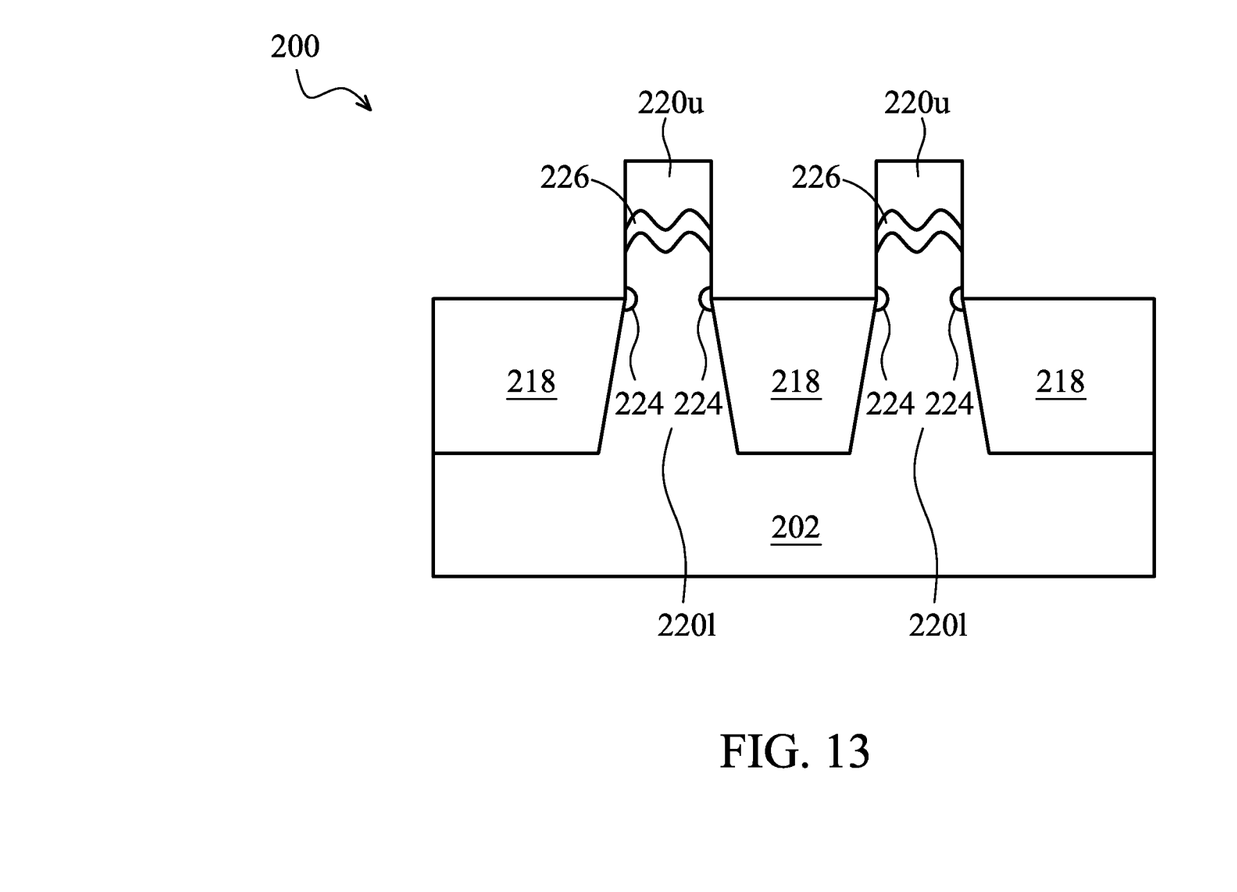

As depicted in FIG. 9 and step 104 in FIG. 1, for fabricating a plurality of pairs of notches in the fin structure 220, the structure in FIG. 9 is produced by performing an oxidation process 240 to the substrate 202 to form a first pair of notches 224 extending into opposite sides of the lower portion 2221 and a second pair of notches 226 extending into opposite sides of the interface 230.

In some embodiments, the step of performing an oxidation process 240 to the substrate 202 comprises annealing the substrate 202 in an oxygen-containing environment. The annealing process uses a high-temperature anneal.

In accordance with some embodiments, the high-temperature anneal includes a spike anneal, which is performed in an oxygen-containing environment (for example, containing $H_2O$, $O_3$, or $O_2$). The annealing temperature may be between about 800° C. and about 1,300° C. The annealing time may be between about 1 second and about 10 seconds.

In accordance with alternative embodiments, the high-temperature anneal includes a soak anneal process by soaking the substrate 202 in an oxygen-containing environment (for example, containing $H_2O$, $O_3$, or $O_2$). The annealing temperature may be between about 800° C. and about 1,200° C. The annealing time may be greater than about 30 seconds.

In accordance with yet alternative embodiments, the high-temperature anneal includes a furnace anneal by exposing the substrate 202 in an oxygen-containing environment (for example, $H_2O$, $O_3$, or $O_2$ containing). The annealing temperature may be between about 450° C. and about 1,200° C. The annealing time may be about one hour or longer.

In some embodiments, the step of performing an oxidation process 240 to the substrate 202 comprises exposing the substrate to an oxygen-containing plasma. In other words, the oxidation process 240 comprises a plasma oxidation using an oxygen-containing gas (such as $H_2O$, $O_3$, or $O_2$) as a process gas.

The plasma oxidation may be performed using a production tool that is used for dry etch, except that instead of using an etchant gas, the oxygen-containing gas is used, and hence the plasma oxidation rather than the etching is performed. The available tools include, and are not limited to, the tools for Inductively Coupled Plasma (ICP), the tools for Transformer Coupled Plasma (TCP), the tools for Electron Cyclotron Resonance (ECR), and the like. In an exemplary plasma oxidation process, in the chamber for the plasma oxidation, the $O_2$ has a pressure of between about 5 mTorr and about 20 mTorr, and the flow rate of $O_2$ may be between about 50 sccm and about 400 sccm. The RF power may be between about 400 watts and about 800 watts, and the DC bias may be between about 0V and about 60V.

In alternative embodiments, the plasma oxidation is performed using downstream plasma. In an exemplary plasma oxidation process, in the chamber for the downstream plasma, $O_2$ has a pressure of between about 500 mTorr and about 2,000 mTorr, and the flow rate of $O_2$ is between about 1,000 sccm and about 4,000 sccm. The process gas may further comprise a forming gas, which includes hydrogen ($H_2$) and nitrogen ($N_2$), with $H_2$ having a flow rat percentage of about 2 percent and about 10 percent in the forming gas. The RF power may be between about 1,000 watts and about 3,000 watts.

As a result of the oxidation, rather than oxidizing outer surfaces of the fin structure 220, a first pair of notches 224 is generated adjacent to contact points 232 between the lower portion 2201 and the top surface 218s of the isolation structure 218, wherein the first pair of notches 224 is lower than the interface 230 and extending into opposite sides of the lower portion 2201 (i.e., in an inward direction), wherein each first notch 224 has a first width $W_1$. In the meantime, a second pair of notches 226 is generated at the interface 230, wherein the second pair of notches 226 is extending into opposite sides of the interface 230 (i.e., in an inward direction), wherein each second notch 226 has a second width $W_2$ greater than the first width $W_1$.

It was found that a high strain generated at interfaces 230 and contact points 232 may promote oxidation, relative to the outer surfaces (with low strain or no strain) of the fin structure 220. Further, the second width $W_2$ is greater than the first width $W_1$ due to more oxygen supply in the interface 230 than in the contact point 228. In some embodiments, a ratio of the second width $W_2$ to the first width $W_1$ is from about 2 to about 100. In some embodiments, a height H between a top surface 224s of the first pair of notches 224 and a top surface 226s of the second pair of notches 226 on same side is in the range of about 1 nm to about 20 nm. Thus, using the first pair of notches 224 and second pair of notches 226, Applicant's method can help narrower carrier transportation path between adjacent fins.

Furthermore, the process conditions are also controlled so that oxygen may penetrate through interface to oxidize the interface regions first. The optimum process conditions are related to various factors including the strain level, the compositions of semiconductor regions (i.e., the upper portion 220u and lower portion 220l) and isolation region, and the oxidation method. The optimum process conditions may be found through routine experimentation.

FIGS. 10-13 are cross-sectional views of a semiconductor device according to various embodiment of the present disclosure. In some embodiments, the interface 230 may be further oxidized until one of the second pair of notches 226 contacts another one of the second pair of notches 226 (shown in FIG. 10). As such, cross-sectional view of the second pair of notches 226 comprises a flat shape. It should be noted that additional oxidation is not desirable due to decreased channel portions, resulting from the reduced volume of the upper portion 220u.

In some embodiments, cross-sectional view of the second pair of notches 226 may comprise a different shape. In some embodiments, cross-sectional view of the second pair of notches 226 comprises a concave shape (shown in FIG. 11). In some embodiments, cross-sectional view of the second pair of notches 226 comprises a convex shape (shown in FIG. 12). In some embodiments, cross-sectional view of the second pair of notches 226 comprises a wavy shape (shown in FIG. 13). As such, cross-sectional view of the second pair of notches 226 comprises a shape selected from flat, concave, convex, or wavy. Thus, using the first pair of notches 224 and second pair of notches 226, Applicant's method can help narrower carrier transportation path between adjacent fins.

It is understood that the FinFET 200 may undergo further CMOS processes to form various features such as gate stack, contacts/vias, interconnect metal layers, dielectric layers, passivation layers, etc. Thus, Applicant's method can help narrower carrier transportation path between adjacent fins. Problems associated with high leakage current due to poor isolation may be avoided. Thus, Applicant's method may achieve the device performance characteristics, such as breakdown effect and leakage.

In accordance with embodiments, a fin structure for a semiconductor device comprises a lower portion protruding from a major surface of a substrate, wherein the lower portion comprises a first semiconductor material having a first lattice constant; an upper portion having an interface with the lower portion, wherein the upper portion comprises a second semiconductor material having a second lattice constant different from the first lattice constant; a first pair of notches lower than the interface and extending into opposite sides of the lower portion, wherein each first notch have a first width; and a second pair of notches extending into opposite sides of the interface, wherein each second notch have a second width greater than the first width.

In accordance with another embodiments, a fin field effect transistor (FinFET) comprises a substrate comprising a major surface; a fin structure protruding from the major surface comprising a lower portion comprising a first semiconductor material having a first lattice constant; an upper portion having an interface with the lower portion, wherein the upper portion comprises a second semiconductor material having a second lattice constant different from the first lattice constant; a first pair of notches lower than the interface and extending into opposite sides of the lower portion, wherein each first notch have a first width; and a second pair of notches extending into opposite sides of the interface, wherein each second notch have a second width greater than the first width; and an isolation structure surrounding the fin structure, wherein a top surface of the isolation structure is lower than the interface.

In accordance with another embodiments, a method of fabricating a semiconductor device comprises providing a substrate having an isolation structure surrounding a fin structure, wherein the fin structure comprises a lower portion and an upper portion having an interface with the lower portion, wherein a top surface of the isolation structure is lower than the interface; and performing an oxidation process to the substrate to form a first pair of notches extending into opposite sides of the lower portion and a second pair of notches extending into opposite sides of the interface.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:
   providing a substrate having an isolation structure surrounding a fin structure, wherein the fin structure comprises a lower portion comprising a first semiconductor material and an upper portion comprising a second semiconductor material different than the first semiconductor material and having an interface with the lower portion, wherein a top surface of the isolation structure is lower than the interface; and
   performing an oxidation process to the substrate to form a first pair of notches extending into opposite sides of the lower portion and a second pair of notches extending into opposite sides of the interface.

2. The method of claim 1, wherein the step of performing an oxidation process to the substrate comprises annealing the substrate in an oxygen-containing environment.

3. The method of claim 1, wherein the step of performing an oxidation process to the substrate comprises exposing the substrate to an oxygen-containing plasma.

4. The method of claim 1, wherein the step of providing a substrate having an isolation structure surrounding a fin structure includes:
   etching a major surface of the substrate to form a first fin;
   surrounding the fin structure with the isolation structure;
   removing a top portion of the first fin to form the lower portion; and
   epitaxially growing the upper on the lower portion.

5. The method of claim 4, further comprising recessing the top surface of the isolation structure below the interface between the upper portion and the lower portion.

6. The method of claim 1 wherein the first pair of notches is formed at a point of contact between the fin structure and the top surface of the isolation structure.

7. The method of claim 4, wherein the second pair of notches extend completely through the fin structure.

8. The method of claim 7, wherein the second pair of notches form a cross-sectional shape selected from the group consisting of flat, convex, concave, and wavy.

9. The method of claim 1 wherein the step of performing an oxidation process to the substrate comprises a high temperature anneal in an oxygen-containing environment at an annealing temperature of between about 800° C. and about 1,300° C.

10. A method of fabricating a semiconductor device, comprising:

forming a fin structure including a lower portion of a first material having a first lattice constant and an upper portion of a second material having a second lattice constant and an interface between the first material and the second material;

forming an isolation structure surrounding the lower portion, wherein the interface and the upper portion extend above an topmost surface of the isolation structure; and selectively oxidizing portions of the fin structure to form a first ring extending into the lower portion from sidewalls of the fin structure at a point of contact between the lower portion and the topmost surface of the isolation structure, and to form a second ring extending into the fin structure from the sidewalls of the fin structure at the interface.

11. The method of claim 10, wherein the step of forming a fin structure including a lower portion of a first material and an upper portion of a second material and an interface between the first material and the second material includes:
   forming a fin of the first material;
   removing a top portion of the first material; and
   epitaxially growing the second material on the first material.

12. The method of claim 10, wherein the step of forming an isolation structure surrounding the lower portion, wherein the interface and the upper portion extend above an topmost surface of the isolation structure comprises:
   forming a fin of the first material;
   depositing the isolation structure around the fin;
   etching back the fin to have an topmost surface below a topmost surface of the isolation structure, thereby forming the lower portion;
   growing the upper portion on the lower portion; and
   recessing the topmost surface of the isolation structure to below the interface.

13. The method of claim 10, wherein the second ring extends completely through the fin structure.

14. The method of claim 10, wherein the step of selectively oxidizing portions of the fin structure includes subjecting the fin structure to an annealing temperature of from about 800° C. and about 1,300° C. in an oxygen-containing environment.

15. The method of claim 10, wherein the first ring extends into the fin a first distance and the second ring extends into the fin a second distance and the ratio between the second distance and the first distance is from about 2 to about 100.

16. A method of fabricating a semiconductor device comprising:
   forming a pad layer over a semiconductor substrate and a hard mask layer over the pad layer;
   patterning the pad layer and the mask layer;
   patterning the semiconductor substrate to form a first fin and a second fin extending from the semiconductor substrate and a trench between the first fin and the second fin;
   depositing a dielectric material to surround the first fin and the second fin;
   planarizing the first fin, the second fin and the dielectric material;
   recessing a top surface of the first fin and of the second fin to form a first lower fin portion with a first cavity thereabove and a second lower fin portion with a second cavity thereabove;
   filling the first cavity with a first upper fin portion forming a first interface with the first lower fin portion to form a first fin structure, and filling the second cavity with a second upper fin portion forming a second interface with the second lower fin portion to form a second fin structure;
   recessing the dielectric material to have a topmost surface at a level below the first interface and the second interface; and
   forming a first oxide ring extending into the first fin structure, and forming a second oxide ring extending into the first fin structure at the first interface, the second oxide ring extending further into the first fin structure than the first oxide ring; and
   forming a third oxide ring extending into the second fin structure, and forming a fourth oxide ring extending into the second fin structure at the second interface, the fourth oxide ring extending further into the second fin structure than the third oxide ring.

17. The method of claim 16, wherein the step of filling the first cavity with a first upper fin portion comprises epitaxially growing a semiconductor material, different than the semiconductor material of the first lower fin portion, on the first lower fin portion, and the step of filling the second cavity with a second upper fin portion comprises epitaxially growing the semiconductor material on the second lower fin portion.

18. The method of claim 16, wherein the step of forming the first oxide ring and the second oxide ring comprises annealing the first fin structure in an oxygen-containing environment.

19. The method of claim 16, wherein the first oxide ring is formed at a contact point between the first fin structure and the topmost surface of the dielectric material and the third oxide ring is formed at a contact point between the second fin structure and the topmost surface of the dielectric material.

20. The method of claim 16, further comprising lining the trench with a liner oxide prior to depositing the dielectric material.

* * * * *